(12) United States Patent
Naito et al.

(10) Patent No.: US 11,532,787 B2
(45) Date of Patent: Dec. 20, 2022

(54) PROCESS AND APPARATUS FOR PRODUCING TRANSPARENT ELECTRODE

(71) Applicants: KABUSHIKI KAISHA TOSHIBA, Minato-ku (JP); TOSHIBA ENERGY SYSTEMS & SOLUTIONS CORPORATION, Kawasaki (JP)

(72) Inventors: Katsuyuki Naito, Bunkyo (JP); Naomi Shida, Minato (JP); Mitsunaga Saito, Inzai (JP); Takeshi Niimoto, Kawasaki (JP)

(73) Assignees: KABUSHIKI KAISHA TOSHIBA, Minato-ku (JP); TOSHIBA ENERGY SYSTEMS & SOLUTIONS CORPORATION, Kawasaki (JP)

( * ) Notice: Subject to any disclaimer, the term of this patent is extended or adjusted under 35 U.S.C. 154(b) by 455 days.

(21) Appl. No.: 16/564,563

(22) Filed: Sep. 9, 2019

(65) Prior Publication Data

US 2019/0393416 A1 Dec. 26, 2019

Related U.S. Application Data

(63) Continuation of application No. PCT/JP2018/010371, filed on Mar. 16, 2018.

(51) Int. Cl.
*H01L 51/00* (2006.01)
*H01L 51/44* (2006.01)
*H01L 51/52* (2006.01)

(52) U.S. Cl.
CPC ........ *H01L 51/0021* (2013.01); *H01L 51/442* (2013.01); *H01L 51/5206* (2013.01); *H01L 51/5234* (2013.01)

(58) Field of Classification Search
CPC .................................................. H01L 51/0021
See application file for complete search history.

(56) References Cited

U.S. PATENT DOCUMENTS

| | | | |
|---|---|---|---|
| 4,220,694 A * | 9/1980 | Uetani | H01M 6/12 429/185 |
| 5,270,147 A | 12/1993 | Van Thillo et al. | |
| 8,049,333 B2 | 11/2011 | Alden et al. | |
| 2005/0065400 A1* | 3/2005 | Banik | G06Q 10/08 600/109 |

(Continued)

FOREIGN PATENT DOCUMENTS

| | | |
|---|---|---|
| JP | 5-204116 A | 8/1993 |
| JP | 2010-212096 A | 9/2010 |
| JP | 2010-257690 A | 11/2010 |
| JP | 2012-199175 A | 10/2012 |
| JP | 2013-77435 A | 4/2013 |

(Continued)

OTHER PUBLICATIONS

International Search Report dated May 15, 2018 in PCT/JP2018/010371 filed Mar. 16, 2018 (with English Translation of Categories of Cited Documents).

(Continued)

*Primary Examiner* — William D Young
(74) *Attorney, Agent, or Firm* — Oblon, McClelland, Maier & Neustadt, L.L.P.

(57) ABSTRACT

The embodiments provide a process and an apparatus for easily producing a transparent electrode of low resistance and of high transparency. The process comprises: coating a hydrophobic polymer film with a dispersion of metal nanowires, press-bonding an electroconductive substrate directly onto the metal nanowires on the polymer film, and peeling and transferring the metal nanowires from the polymer film onto the conductive substrate. The embodiments also relates to an apparatus for the process.

10 Claims, 3 Drawing Sheets

(56) References Cited

U.S. PATENT DOCUMENTS

| | | | |
|---|---|---|---|
| 2011/0018424 A1* | 1/2011 | Takada | H01L 31/022466 |
| | | | 313/352 |
| 2012/0027994 A1 | 2/2012 | Takada et al. | |
| 2012/0298170 A1 | 11/2012 | Lee et al. | |
| 2013/0199732 A1* | 8/2013 | Niwa | C09J 7/22 |
| | | | 521/56 |
| 2013/0220218 A1* | 8/2013 | Tsuchida | B05C 11/025 |
| | | | 15/236.1 |
| 2015/0206619 A1 | 7/2015 | Fukui et al. | |
| 2016/0195948 A1 | 7/2016 | Tomohisa et al. | |
| 2017/0088938 A1* | 3/2017 | Ueda | C23C 14/568 |
| 2021/0060500 A1* | 3/2021 | Lee | B01D 69/12 |

FOREIGN PATENT DOCUMENTS

| | | |
|---|---|---|
| JP | 2014-89962 A | 5/2014 |
| JP | 5546763 B2 | 7/2014 |
| JP | 5599980 B2 | 10/2014 |
| JP | 2015-18624 A | 1/2015 |
| JP | 6119873 B2 | 4/2017 |
| JP | 2017-91875 A | 5/2017 |
| JP | 6152105 B2 | 6/2017 |
| JP | 2017-119431 A | 7/2017 |

OTHER PUBLICATIONS

Anuj R. Madaria, et al., "Uniform Highly Conductive, and Patterned Transparent Filmsofa Percolating Silver Nanowire Network on Rigid and Flexible Substrates Using a Dry Transfer Technique", Nano Research 3, 2010, pp. 564-573.

* cited by examiner

PROCESS AND APPARATUS FOR PRODUCING TRANSPARENT ELECTRODE

CROSS-REFERENCE TO RELATED APPLICATIONS

This application is based upon and claims the benefit of priority from the prior International Patent Application No. PCT/JP2018/010371, filed on Mar. 16, 2018, the entire contents of which are incorporated herein by reference.

FIELD

Embodiments of the present disclosure relate to a process and an apparatus for producing a transparent electrode.

BACKGROUND

According to recent increasing of energy consumption, demand for alternative energy replacing fossil fuels has been rising as measures to cope with global warming. As a source of the alternative energy, solar cells have been attracted the attention and hence progressively developed. They are studied for various practical applications. From a practical viewpoint, it is particularly important to improve their flexibility and durability so that they can be installed on various places. However, single crystal silicon solar cells, which are the most basic solar cells, are expensive and it is difficult to produce flexible ones. On the other hand, organic solar cells and organic-inorganic hybrid solar cells, in which many researchers have been lately interested, have room for improvement in durability.

In addition to the above solar cells, other photoelectric conversion devices, such as organic EL devices and photosensors, have been also researched with the aim of improving their flexibility and durability. Those devices usually comprise indium-doped tin oxide (hereinafter, often referred to as "ITO") as transparent anodes. The ITO films are normally formed by sputtering or the like. In order that the ITO films can have high electroconductivity, it is necessary to carry out the sputtering procedure at a high temperature and to anneal thereafter the formed films at a high temperature. However, it is often the case that organic materials cannot be subjected to those procedures at a high temperature. In view of that, it is examined to replace ITO with silver nanowires, from which a film can be formed at a low temperature. Meanwhile, silver nanowires are normally dispersed in water or alcohol and then the dispersion is laid on a substrate to form a film. Accordingly, when the substrate is undesired to be in contact with the solvent, the film is often formed by a transfer method. However, in known processes, the transferring step is complicated. Specifically, it is often necessary to provide an adhesive layer for transferring the silver nanowire film, or otherwise if the adhesive layer is not provided, it is necessary to transfer the silver nanowire film twice.

DETAILED DESCRIPTION

Embodiments will now be explained with reference to the accompanying drawings.

The process for producing a transparent electrode according to the embodiment, comprises:

coating a hydrophobic polymer film directly with a dispersion containing metal nanowires, to form a metal nanowire film, press-bonding an electroconductive substrate having a surface of higher hydrophilicity than said polymer film onto the surface of said metal nanowire film, and peeling and transferring said metal nanowire film from said polymer film onto said electroconductive substrate.

Further, the apparatus for producing a transparent electrode according to the embodiment, comprises:

a coating unit in which a hydrophobic polymer film is coated with a dispersion containing metal nanowires, to form a metal nanowire film on said polymer film, a press-bonding unit in which said metal nanowire film is directly press-bonded onto a substrate, and a peeling unit in which said polymer film and said substrate are separated from each other.

Embodiment 1

Figure 1A:
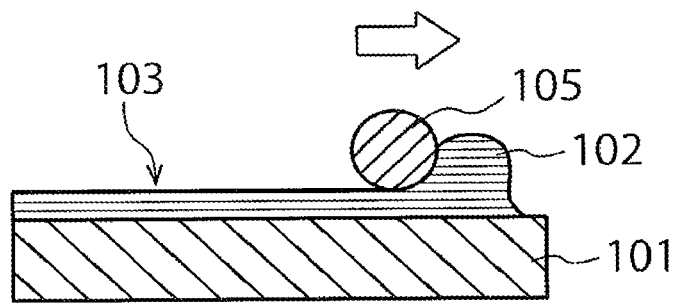
FIG. 1A is a schematic sectional view showing a step for forming a metal nanowire film in a transparent electrode-production process according to the embodiment.
Figure 1B:
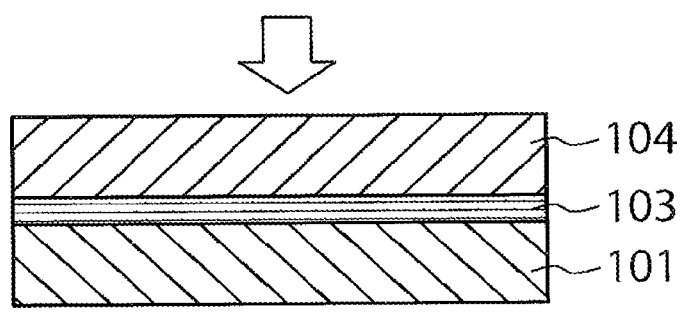
FIG. 1B is a schematic sectional view showing a step for press-bonding an electroconductive substrate on the metal nanowire film in a transparent electrode-production process according to the embodiment.
Figure 1C:
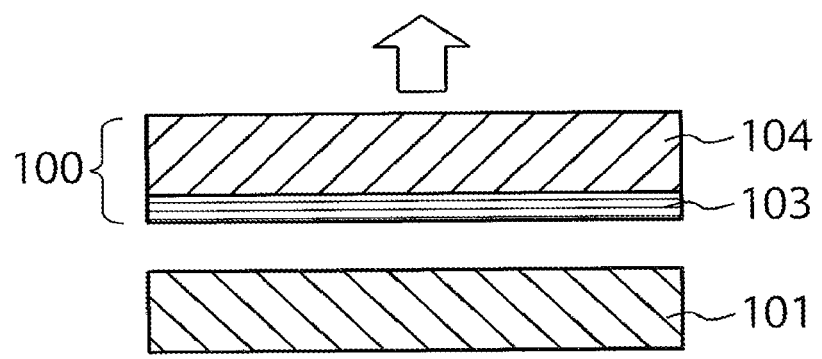
FIG. 1C is a schematic sectional view showing a step for transferring the metal nanowire film onto the electroconductive substrate in a transparent electrode-production process according to the embodiment.

First, the process and the apparatus for producing a transparent electrode according to the first embodiment is explained with reference to FIGS. 1A to C. FIGS. 1A to C schematically show the process for producing a transparent electrode 100 according to the embodiment. The process comprises: a step A in which a hydrophobic polymer film 101 is directly coated with a dispersion 102 containing metal nanowires, to form a metal nanowire film 103 (FIG. 1A); a step B in which an electroconductive substrate 104 having a surface of higher hydrophilicity than the polymer film 101 is directly press-bonded onto the surface of the metal nanowire film 103 formed on the polymer film 101 (FIG. 1B); and a step C in which the polymer film 101 and the metal nanowire film 103 are separated from each other to transfer the metal nanowire film 103 onto the electroconductive substrate 104 (FIG. 1C).

(Step A)

First, a hydrophobic polymer film 101 is directly coated with a dispersion 102 containing metal nanowires, to form a metal nanowire film 103.

The dispersing 102 is directly laid on the polymer film 101. In the embodiment, transferring is carried out by use of difference of hydrophilicity between the polymer film and the below-described substrate, and therefore the dispersing is directly applied on the polymer film. It is unnecessary in the embodiment to provide an adhesive layer, which is generally used in known processes.

The dispersion 102 can be spread on the polymer film, for example, in a manner in which the dispersion is supplied to a gap between the film and a bar 105 positioned apart from and parallel to the film and then the bar or the film is shifted. The gap between the polymer film and the bar can be controlled according to the materials of the polymer film and the dispersion and also to the kind of the bar. The dispersion may be supplied from a nozzle into the gap between the film and the bar, and the bar may fulfill a function of the nozzle.

In another way, the dispersion may be spray-coated onto the polymer film. The dispersion may be sprayed from plural fixed nozzles or from one or a few nozzles moved reciprocatingly.

After the metal nanowire film 103 is formed by coating, the dispersion medium can be partly or fully removed by heating or decompression, if necessary.

The polymer film 101 is hydrophobic. In the embodiment, "hydrophobic" means having a contact angle to pure water at 30° C. in a range of 80° or more, preferably 90° or more. The polymer film is preferably made of material comprising a fluorine-containing polymer. Typical examples of the fluorine-containing polymer are fluorohydrocarbons, in which hydrogen atoms in hydrocarbons are partly or fully replaced with fluorine atoms. Among the fluorohydrocarbons, most preferred is a tetrafluoroethylene polymer in view of heat resistance, solvent resistance, and releasability. In addition, a polymer film made of tetrafluoroethylene polymer is easy to wash and hence that polymer is preferred also in view of repeating use. Examples of other fluorohydrocarbons include: homopolymers and copolymers of fluorine-containing monomers, such as, vinylidene fluoride and perfluoroalkyl vinylether; and copolymers of fluorine-containing monomers and hydrocarbons, such as, ethylene and polypropylene. Further, silicone resins are also employable as materials of the hydrophobic polymer. The polymer film may contain glass fiber, carbon fiber or the like inside for the purpose of reinforcement.

Those polymers tend to be negatively charged. Accordingly, if also charged negatively, the metal nanowires are easily released and transferred from them. The electrification tendency can be estimated by measuring a zeta potential in water or an organic solvent, and the metal nanowires preferably have a lower potential than the polymer film. In consideration of the atmospheric environment containing carbon dioxide, the zeta potential in water at pH 6 is preferably adopted.

The zeta potential of the metal nanowire dispersion can be measured in a capillary cell by means of a Zetasizer Nano ZS ([trademark], manufactured by Malvern Instruments) according to the electrophoretic light scattering method. The pH value in water is controlled by adding diluted hydrochloric acid or diluted aqueous potassium hydroxide solution into pure water dispersed with metal nanowire.

The zeta potential of the polymer film can be measured in a cell for flat-plate zeta potential measurement with tracer particles of polystyrene latex by means of a Zetasizer Nano ZS ([trademark], manufactured by Malvern Instruments) according to the electrophoretic light scattering method. The pH value in water is controlled by adding diluted hydrochloric acid or diluted aqueous potassium hydroxide solution into pure water.

In the embodiment, there are no particular restrictions on the metal contained in the metal nanowires. However, in view of electroconductivity and the like, the nanowires preferably comprise a metal selected from the group consisting of silver, silver alloys, copper and copper alloys, and it is particular preferred for the nanowires to comprise silver.

As the medium in the dispersion, water, alcohols or mixtures thereof are employed. Among them, water is inexpensive and most preferred from the ecological viewpoint. However, if the dispersion medium consists of only water, it is generally difficult to coat the polymer film. Accordingly, in order to ease the coating procedure, it is preferred to carry out spray-coating while the hydrophobic polymer is kept at a high temperature.

When alcohols are adopted as the dispersion medium, the dispersion can be easily laid even on the hydrophobic polymer because having low surface tensions. The alcohols are preferably ones evaporating at relatively low temperatures, such as, methanol, ethanol, n-propanol, 2-propanol, n-butanol and mixtures thereof. Those alcohols can be mixed with water to prepare mixed dispersion media, which are also employable. The dispersion medium may contain a dispersant. Examples of the dispersant include: polymer compounds, such as, polyvinylpyrrolidone and polyvinyl alcohol; and low molecular weight compounds, such as, t-butoxyethanol and diethylene glycol mono-t-butyl ether.

In the metal nanowire film 103, a plural number of the metal nanowires are partly fused or in contact with each other to form a mesh-shaped or lattice-shaped network structure, so that electroconductive paths are produced to constitute an electroconductive cluster (percolation conduction theory). For constituting the electroconductive cluster, the nanowires need to lie in some number density. The longer the nanowires are, the more readily the conductive cluster is generally produced. In addition, the larger diameters the nanowires have, the larger the electroconductivity is. Thus, since the nanowires form a network structure, the film as a whole shows high electro-conductivity although containing the metal in a small amount. Specifically, the coating amount of the nanowires is normally 0.05 to 50 $g/m^2$, preferably 0.1 to 10 $g/m^2$, more preferably 0.15 to 1 $g/m^2$. Even if coated with the metal nanowires in the above density range, the resultant nanowire film has the advantage of being flexible.

The metal nanowire film 103 normally comprises metal nanowires having diameters of 10 to 500 nm and lengths of 0.1 to 50 μm. The diameters and lengths of the metal nanowires can be determined, for example, by analyzing a SEM image selected with a scanning electron microscope (SEM).

If having too small diameters, the nanowires in themselves tend to have large electrical resistance. On the other hand, if the diameters are too large, light-scattering or the like may increase to reduce the transparency. Those troubles can be avoided when the silver nanowires have diameters of 20 to 150 nm. More preferably, the nanowires have diameters of 35 to 120 nm.

If the nanowires have too short lengths, the conductive cluster may be formed so insufficiently that the resistance tends to increase. On the other hand, if having too long lengths, the metal nanowires are often unable to disperse stably in producing an electrode or the like. Those troubles can be avoided when the metal nanowires have lengths of 1 to 40 μm. More preferably, the metal nanowires have lengths of 5 to 30 μm.

The metal nanowires can be produced in any manner. For example, silver nanowires can be obtained by reducing an aqueous solution of silver ions with various reducing agents. The shapes and sizes of the silver nanowires can be controlled by selecting the kinds of the reducing agent, protective polymer or dispersant, and coexistent ions. In producing silver nanowires, it is preferred to adopt a polyhydric alcohol, such as ethylene glycol, as the reducing agent and polyvinylpyrrolidone as the protective polymer. From those materials, what is called "nanowires" of nano-order size can be obtained.

The dispersion can also contain metal nanoparticles. For example, the dispersion of silver nanowires may contain silver nanoparticles. Because readily aggregating with the silver nanowires, the silver nanoparticles serve as an adhesive favorably combining the silver nanowires with each other, and as a result, they fulfil a function of reducing electrical resistance of the nanowire film as an electroconductive film.

(Step B)

Then, onto the surface of the metal nanowire film 103 formed in Step A, an electroconductive substrate 104 is directly press-bonded. This press-bonding step gives a temporal stack comprising the polymer film, the metal nanowire film and the conductive substrate. Here, the conductive substrate needs to have a surface of higher hydrophilicity than the polymer film. In the embodiment, the metal nanowire film 103 is transferred by use of difference of hydrophilicity between the polymer film and the conductive substrate, and hence it is unnecessary to provide an adhesive layer, which is generally used in known processes, on the surface of the conductive substrate.

There are no particular restrictions on the pressure applied in the press-bonding step. However, the step is carried out in order that the metal nanowire film and the conductive substrate may adhere closely without gaps to form a stack, and accordingly it is unnecessary to apply excess pressure.

The conductive substrate 104 preferably has a surface provided with an electroconductive film made of transparent electroconductive metal oxide, such as, indium-tin oxide (ITO), aluminum-doped zinc oxide (AZO), tin oxide, vanadium-doped titanium; of electroconductive polymer such as PEDOT:PSS; or of graphene. Composite films thereof are also usable. The surface resistance of the conductive substrate is preferably reduced by the metal nanowire film transferred thereon. The substrate preferably has a surface made of inorganic material. Examples of the inorganic material include ITO, AZO and tin oxide. Those inorganic materials can be made so hydrophilic by dry processes, such as UV/ozone treatment, that the metal nanowire film can be easily transferred thereon. The substrate may be beforehand provided with a device. For example, in a process for producing a solar cell or an organic EL device, the metal nanowire film may be transferred onto the top transparent electrode part thereof.

The electroconductive film made of graphene preferably has a layered structure comprising one or more and four or less monomolecular layers of graphene (hereinafter, referred to as graphene monolayers) on average. The graphene is preferably unsubstituted graphene, nitrogen-doped graphene or boron-doped graphene. Among them, unsubstituted graphene and boron-doped graphene are suitable for anode material, and nitrogen-doped graphene is suitable for cathode material. The doped amount (N/C atomic ratio) can be determined by XPS, and is preferably 0.1 to 30 atom %, more preferably 1 to 10 atom %. The graphene layer shows such a high shielding effect as to prevent acids and/or halogens from diffusion and thereby to prevent the metal nanowires from deterioration. Further, since containing nitrogen, the nitrogen-doped graphene layer has high acid-trapping ability and accordingly shows a higher shielding effect.

In the step shown in FIG. 1B, the metal nanowire film is directly press-bonded onto the substrate with a flat-plate pressing machine. For example, the polymer film is fixed on a bolster plate of the pressing machine while the conductive substrate is fixed on a slide, so that the conductive substrate can be press-bonded onto the metal nanowire film.

(Step C)

Subsequently, the metal nanowire film is peeled from the polymer film, and thereby transferred onto the conductive substrate. In the step shown in FIG. 1C, the procedure is carried out by applying pressure in the direction opposite to that applied for press-bonding.

Specifically, if the press-bonding is carried out with the pressing machine in the above manner, the slide is moved in the direction for separating from the bolster plate.

As a result, the metal nanowire film is transferred onto a relatively highly hydrophilic surface of the electroconductive substrate, to form a transparent electrode.

(Optional Additional Steps)

The production process may further comprise, after the metal nanowire film is transferred, a step in which auxiliary metal wiring is formed on the surface of the transferred metal nanowire film. The auxiliary metal wiring is used for collecting currents. The auxiliary metal wiring is preferably made of silver, gold, copper, molybdenum, aluminum or alloys thereof. The auxiliary metal wiring may be partly in contact with the conductive substrate so as to enhance the electrical connection between the substrate and the metal nanowire film. Specifically, the auxiliary metal wiring may lead from the surface of the metal nanowire film, penetrate through the nanowire film and connect to the conductive substrate. In another way, the auxiliary metal wiring may be beforehand formed on the conductive substrate.

The auxiliary metal wiring layer 105 can be in the shape of lines, combs, meshes or the like.

The production process may also comprise, after the metal nanowire film is transferred, a step in which the metal nanowire film 103 is coated with an insulating layer made of polymer or insulating metal oxide. The insulating layer further preferably also functions as a UV-cut layer or a gas-barrier layer.

In order to serve as a ultraviolet-cut layer, the insulating layer preferably contains an ultraviolet absorber. Examples of the ultraviolet absorber include: benzophenones, such as, 2-hydroxy-4-methoxybenzophenone, 2,2-dihydroxy-4-methoxybenzophenone, 2-hydroxy-4-methoxy-2-carboxybenzophenone, and 2-hydroxy-4-n-octoxybenzophenone; benzotriazoles, such as, 2-(2-hydrxy-3,5-di-t-butylphenyl)benzotriazole, 2-(2-hydrxy-5-methylphenyl)benzotriazole, and 2-(2-hydrxy-5-n-octylphenyl)benzotriazole; and salicylic esters, such as, phenyl salicylate and p-octylphenyl salicylate. The absorbers are preferably capable of cutting UV light in the wavelength range of 400 nm or less.

The gas-barrier layer blocks preferably water vapor and oxygen, particularly preferably water vapor. This layer is preferably, for example, a film of inorganic substance such as SiN, $SiO_2$, SiC, $SiO_xN_y$, $TiO_2$ or $Al_2O_3$. Further, it may be a super-thin glass sheet. There are no particular restrictions on the thickness of the gas-barrier layer. The gas-barrier layer is preferably thick enough to serve fully as a barrier against gases. On the other hand, however, the layer is preferably thin enough to ensure flexibility or bendability. In view of those, the gas-barrier layer has a thickness of preferably 0.01 to 3000 µm, more preferably 0.1 to 100 µm. The gas-barrier layer has a water-vapor permeability (moisture permeability) of preferably $10^2$ to $10^{-6}$ g/m²·d, more preferably $10^1$ to $10^{-5}$ g/m²·d, further preferably $10^0$ to $10^{-4}$ g/m²·d. The moisture permeability can be measured according to JIS Z0208 and the like. The gas-barrier layer is preferably formed by dry processes. Examples of the dry processes for forming the gas-barrier layer include: vacuum deposition processes, such as, resistance heating deposition, electron beam deposition, induction heating deposition, and plasma or ion-beam assisted deposition; sputtering processes, such as, reactive sputtering, ion beam sputtering, ECR (electron cyclotron resonance) sputtering; PVD (physical vapor deposition) processes, such as, ion plating; and CVD (chemical vapor deposition) processes employing heat, light or plasma. Among them, preferred are vacuum deposition processes, in which a film of the layer is formed by deposition in vacuum.

Embodiment 2-1

Figure 2:
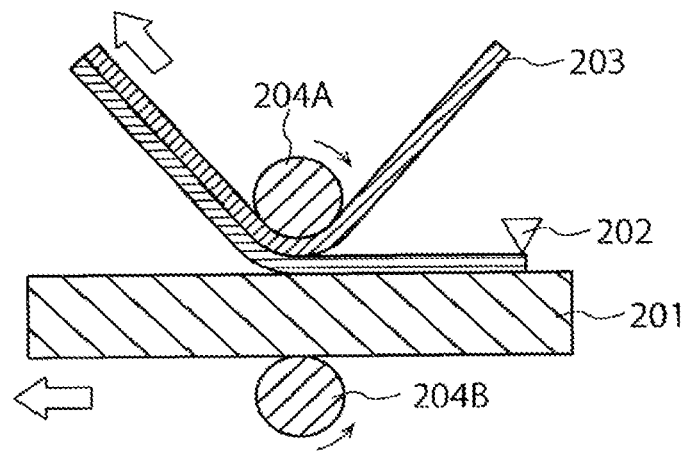
FIG. 2 is a schematic sectional view showing a transparent electrode-production apparatus according to the embodiment.

The structure of a transparent electrode-production apparatus according to the second embodiment is explained below with reference to FIG. 2. FIG. 2 schematically shows the structure of an apparatus according to the embodiment for producing a transparent electrode. The apparatus comprises: a member 202 with which a dispersion of metal nanowires is laid on a hydrophobic polymer film 201; a press-bonding member 204A with which the metal nanowire dispersion on the polymer film is at least partly press-bonded directly onto a substrate 203; and a press-bonding assistant member 204B which assists the press-bonding between the polymer film and the substrate.

In FIG. 2, the press-bonding member 204A is a roller placed at such a position that it can press-bond a stack in which the polymer film and the substrate are laminated while they are being conveyed between the member 204A and the assistant member 204B. Although the assistant member 204B in FIG. 2 is a roller, it may be a flat plate as long as the press-bonding member 204A can press-bond the stack. However, as described later, those press-bonding members are preferably rollers in order to continuously produce a transparent electrode.

After coated with the dispersion, the polymer film 201 is conveyed to between the press-bonding member 204A and the assistant member 204B and then press-bonded together with the electroconductive substrate 203. Accordingly, in this step, the stack is formed at the same time as it is press-bonded.

Immediately after conveyed from between the press-bonding member 204A and the assistant member 204B, the stack can be separated. Specifically, the polymer film 201 and the conductive substrate 203 are pulled in different directions, so that they are separated gradually from the point between the members 204A and 204B. This means that the press-bonding member 204A and the assistant member 204B in FIG. 2 partly constitute the peeling unit. The peeling unit also comprises a member (not shown) with which the polymer film 201 and the conductive substrate 203 are pulled in different directions.

The metal nanowire film is thus transferred onto the electroconductive substrate by means of the apparatus described above, to produce a transparent electrode.

The apparatus shown in FIG. 2 can be adopted for continuous production based on a roll-to-roll method. Specifically, for example, the polymer film is supplied from a roll before coated with the dispersion or before press-bonded while the conductive substrate is supplied from another roll before press-bonded, and thereafter the peeled polymer film and the produced transparent electrode are individually taken up into rolls. In this system, the pressure in difference of the press-bonding procedure can be easily controlled. Further, the press-bonding members (rollers) can be easily replaced, and hence the system is excellent in maintainability.

The production apparatus may be equipped with a heating member for hating the metal nanowire film, the polymer film or the substrate.

Furthermore, the production apparatus may be equipped with a washing member for cleaning the polymer film before the dispersion is laid thereon. Examples of the washing member include brushes and doctor blades.

Embodiment 2-2

Figure 3:
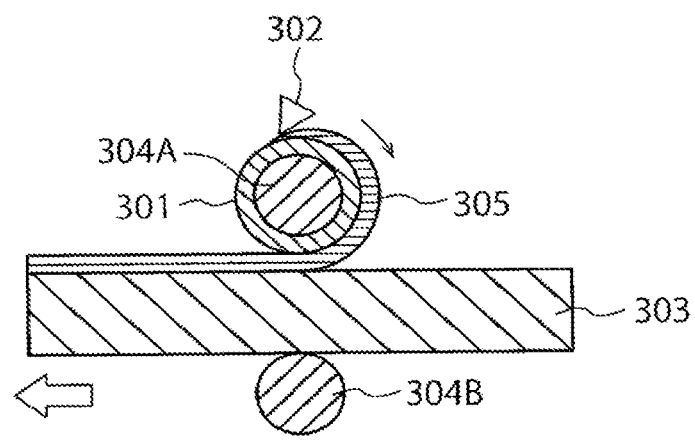
FIG. 3 is a schematic sectional view showing another transparent electrode-production apparatus according to the embodiment.

The structure of another transparent electrode-production apparatus according to the second embodiment is explained below with reference to FIG. 3. FIG. 3 schematically shows the structure of another apparatus according to the embodiment for producing a transparent electrode. The apparatus comprises: a member 302 with which a dispersion of metal nanowires is laid on a hydrophobic polymer film 301; a press-bonding member 304A with which the metal nanowire dispersion on the polymer film is at least partly press-bonded directly onto a substrate 303; and a press-bonding assistant member 304B which assists the press-bonding between the polymer film and the substrate. In this apparatus, the polymer film 301 is wrapped around the press-bonding member 304A in the shape of a rotating drum.

In FIG. 3, the polymer film 301 wrapped around the member 304A is coated with the dispersion to form a metal nanowire film 305.

The press-bonding member 304A rotates so as to draw the conductive substrate 303 into between the members 304A and 304B. At that time in the gap between the members 304A and 304B, the metal nanowire film 305 on the polymer film 301 is press-bonded onto the conductive substrate 303. Accordingly, similarly to the embodiment 2-1, the stack is formed at the same time as it is press-bonded in this step.

When the conductive substrate 303 is drawn out from between the members 304A and 304B, the metal nanowire film 305 is transferred onto the conductive substrate 303. At the same time, the metal nanowire film 305 is released from the polymer film. This means that the press-bonding member 304A and the assistant member 304B in FIG. 3 partly constitute the peeling unit. The peeling unit also comprises a member (not shown) with which the conductive substrate 303 is drawn out.

The metal nanowire film is thus transferred onto the electroconductive substrate by means of the apparatus described above, to produce a transparent electrode.

The embodiments are further explained by the following examples.

EXAMPLE 1

An ITO layer is formed by sputtering on a 10-cm square piece of PET film, to produce an electroconductive film which is provided with the ITO layer on the surface and which has a surface resistance of 300 Ω/square.

Meanwhile, silver nanowires having a diameter of 70 nm are dispersed in water, to prepare a 0.3 wt % dispersion. The aqueous silver nanowire dispersion is spray-coated on a 10-cm square piece of polytetrafluoroethylene sheet of 100 µm thickness placed on a stage heated at 120° C., to form a metal nanowire film. The zeta potentials in water at pH 6 of the polytetrafluoroethylene sheet and the silver nanowires are −17 mV and −30 mV, respectively.

The conductive film and the sheet are so laminated that the silver nanowire film may be faced onto the ITO layer, to produce a stack on the stage heated at 100° C. After a metal plate is placed on the stack, the stack is directly press-bonded. Subsequently, the PET film is peeled from the edge, and the polytetrafluoroethylene sheet is also peeled so as to transfer the silver nanowire film onto the ITO layer.

As a result, the silver nanowire film is almost completely transferred, to obtain a transparent electrode having a surface resistance of 9 Ω/square.

EXAMPLE 2

ITO is sputtered on a 10-cm square piece of PET film, to produce an electroconductive film which is provided with an ITO layer on the surface and which has a surface resistance of 300 Ω/square.

Meanwhile, silver nanowires having a diameter of 30 nm are dispersed in isopropanol, to prepare a 0.5 wt % dispersion. After a 10-cm square piece of polytetrafluoroethylene sheet of 100 μm thickness is placed on a stage heated at 60° C., the silver nanowire dispersion is held between the Teflon sheet and a columnar bar of 5 mm diameter (gap: 500 μm). The dispersion forms a meniscus between the Teflon sheet and the bar. The bar is then moved at a speed of 5 mm/second, to spread the silver nanowire dispersion.

The film and the sheet are so laminated that the silver nanowire film may be faced onto the ITO layer, to produce a stack on the stage heated at 120° C. A metal roller is then rolled on the stack from the edge, to press-bond the stack directly. Successively, the peeling step is carried out so as to transfer the silver nanowire film onto the ITO layer.

As a result, the silver nanowire film is almost completely transferred, to obtain a transparent electrode having a surface resistance of 10 Ω/square.

EXAMPLE 3

Figure 4:
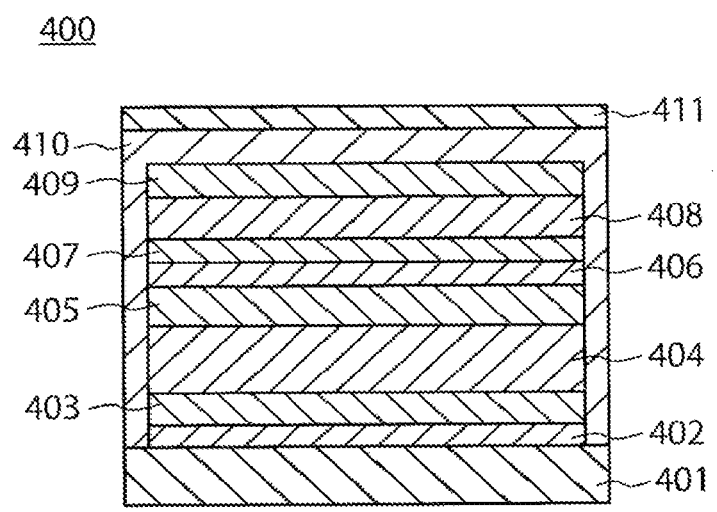
FIG. 4 is a schematic sectional view showing the structure of the solar cell in Example 3.

A solar cell 400 shown in FIG. 4 is produced.

A stainless foil 401 provided with an insulating ceramic layer on the back surface thereof is surface-treated with a diluted hydrochloric acid to remove a surface oxide film from the front surface, and then the front surface is coated with an aqueous solution of graphene oxide by means of a bar-coater to form a graphene oxide layer. After dried at 90° C. for 20 minutes, the graphene oxide layer is treated with hydrated hydrazine vapor at 110° C. for 1 hour and thereby converted into a shielding layer 402 of bilayer N-graphene layer in which carbon atoms in graphene oxide are partly replaced with nitrogen atoms.

The N-graphene layer 402 is then coated with an aqueous solution of PEDOT•PSS by means of a bar-coater, and dried at 100° C. for 30 minutes, to form a buffer layer 403 (thickness: 50 nm) containing PEDOT•PSS.

Subsequently, the buffer layer 403 is coated with a chlorobenzene solution containing poly(3-hexylthiophene-2,5-diyl) (hereinafter, referred to as "P3HT") and C60-PCBM by means of a bar-coater, and dried at 100° C. for 20 minutes, to form a photoelectric conversion layer 404.

Further, the photoelectric conversion layer 404 is coated with a toluene solution of C60-PCBM by means of a bar-coater, and dried to form a buffer layer 405.

Still further, the buffer layer 405 is coated with an aqueous solution of graphene oxide by means of a bar-coater to form a graphene oxide layer. After dried at 90° C. for 20 minutes, the graphene oxide layer is treated with hydrated hydrazine vapor at 110° C. for 1 hour and thereby converted into a shielding layer 406 of bilayer N-graphene layer in which carbon atoms in graphene oxide are partly replaced with nitrogen atoms.

On the surface of the shielding layer 406, an amorphous ITO layer 407 (thickness: 400 nm) is formed by sputtering at room temperature and then annealed with an IR lamp under nitrogen atmosphere to partly crystalize the ITO layer.

Meanwhile, silver nanowires having a diameter of 70 nm are dispersed in water, to prepare a 0.3 wt % dispersion. The silver nanowire dispersion is spray-coated on a polytetrafluoro-ethylene sheet of 100 μm thickness placed on a stage heated at 120° C., to form a silver nanowire film.

The above layered stack is so placed on a stage heated at 100° C. that the ITO layer may be positioned at the top surface, and then the sheet is overlaid thereon so that the silver nanowire film may be in contact with the ITO layer. Subsequently, a metal roller is rolled thereon from the edge so that the metal nanowire film may adhere to the ITO layer. The peeling step is then carried out so as to leave the silver nanowire film on the ITO layer. Thus, a silver nanowire layer 408 is produced.

Thereafter, copper is mesh-wise sputtered in a 10% area of the transparent electrode, to form an auxiliary metal wiring layer 409. The whole body is then coated with a thermosetting silicone resin and heated to form an insulating layer 410 of 40 μm thickness. The insulating layer is screen-printed with UV-cut ink to form a UV-cut layer 411. The UV-cut layer is then coated with silica by CVD to form a gas-barrier layer (not shown). Finally, the outer periphery is sealed, to produce a solar cell.

The obtained solar cell shows an energy-conversion efficiency of 5% or more when irradiated with sunlight of 1 SUN.

EXAMPLE 4

The procedure of Example 1 is repeated except for replacing the polytetrafluoroethylene sheet with a polydimethylsiloxane sheet, to produce a transparent electrode. The silver nanowire film is almost transferred. However, as compared with Example 1, a few fragments of the film are found to remain not transferred.

Example 5

Figure 5:
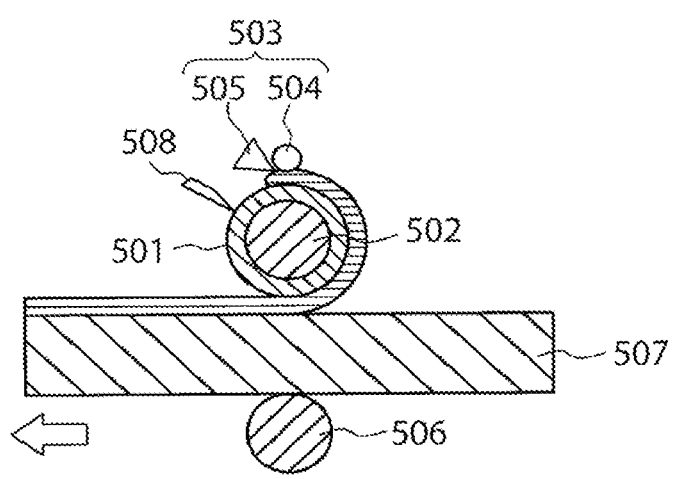
FIG. 5 is a schematic sectional view showing the structure of the production apparatus in Example 5.

The apparatus shown in FIG. 5 is used to produce a transparent electrode.

A polytetrafluoroethylene sheet 501 is wrapped around a rotating drum 502. The rotating drum is equipped with a heater therein (not shown). In the apparatus, there is a member 503 for laying a metal nanowire dispersion, and the member 503 comprises a columnar metal bar 504 and a nozzle 505 from which the metal nanowire dispersion is supplied. There is also a metal roller 506 on the side opposite to the rotating drum, and the metal roller 506 fulfills a function of assisting press-bonding. Further, the apparatus comprises a winding-up mechanism with which a substrate 507 is conveyed (not shown) and a brush 508 with which the polytetrafluoroethylene sheet is cleaned.

In the above apparatus, a silver nanowire film is continuously transferred onto a roll of PET film provided with an ITO layer on the surface thereof. Thus, a transparent electrode is produced.

DESCRIPTION OF THE REFERENCE NUMERALS

100: transparent electrode,
101: hydrophobic polymer film,

102: metal nanowire dispersion,
103: metal nanowires,
104: electroconductive substrate,
105: bar
201: hydrophobic polymer film,
202: member for laying metal nanowires,
203: substrate,
204A: press-bonding member,
204B: press-bonding assistant member
301: hydrophobic polymer film,
302: member for laying metal nanowires,
303: conductive substrate,
304A: press-bonding member,
304B: press-bonding assistant member
305: metal nanowires,
400: solar cell,
401: stainless foil,
402: shielding layer,
403: buffer layer,
404: photoelectric conversion layer,
405: buffer layer,
406: shielding layer,
407: ITO layer,
408: silver nanowire layer,
409: auxiliary metal wiring layer,
410: insulating layer,
411: UV-cut layer,
501: polytetrafluoroethylene sheet,
502: rotating drum,
503: member for laying metal nanowires,
504: metal bar,
505: nozzle,
506: metal roller,
507: substrate,
508: brush While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fail within the scope and spirit of the invention.

The invention claimed is:

1. A process for producing a transparent electrode, comprising:
    coating a hydrophobic polymer film directly with a dispersion containing metal nanowires, to form a metal nanowire film;
    press-bonding an electroconductive substrate having a surface of higher hydrophilicity than said polymer film onto the surface of said metal nanowire film; and
    peeling and transferring said metal nanowire film from said polymer film onto said electroconductive substrate,
    wherein said metal nanowires have a lower zeta potential than the polymer film, and
    wherein the process further comprises:
    wrapping said polymer film around a rotating drum;
    turning said rotating drum;
    supplying said dispersion to the surface of said polymer film to form said metal nanowire film; and
    then press-bonding said metal nanowire film onto the surface of said substrate on a down-stream side of the area where said dispersion is supplied around the rotating drum.

2. The process according to claim 1, wherein said polymer film is made of material comprising a fluorine-containing polymer.

3. The process according to claim 2, wherein said fluorine-containing polymer is polytetrafluoroethylene.

4. The process according to claim 1, wherein said dispersion is laid between the polymer film and a bar positioned apart from and parallel to said film and then the bar or the polymer film is shifted to form a metal nanowire film.

5. The process according to claim 1, wherein said dispersion is spray-coated onto the polymer film to form a metal nanowire film.

6. The process according to claim 1, wherein said dispersion contains an alcohol as a dispersion medium.

7. The process according to claim 1, wherein said metal nanowires comprise silver.

8. The process according to claim 1, comprising the procedures of:
    superposing said metal nanowire film on said substrate surface so that they may be in contact with each other, to form a stack; conveying said stack into a pressing zone between a fixing roller and a pressing roller, so as to press-bond said metal nanowire film onto said substrate;
    and successively separating the stack conveyed out of said pressing zone by peeling said polymer film from said substrate.

9. The process according to claim 1, wherein said substrate has a surface made of inorganic material.

10. The process according to claim 1, wherein said metal nanowires comprise copper.

* * * * *